United States Patent
Al-Khabbaz et al.

(10) Patent No.: US 11,721,976 B2
(45) Date of Patent: *Aug. 8, 2023

(54) SYSTEM FOR ANALYZING LOAD FLOW OF A POWER DISTRIBUTION SYSTEM

(71) Applicant: KING FAHD UNIVERSITY OF PETROLEUM AND MINERALS, Dhahran (SA)

(72) Inventors: Mustafa Mohammed J. Al-Khabbaz, Dhahran (SA); Mohammad A. Abido, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 87 days.

This patent is subject to a terminal disclaimer.

(21) Appl. No.: 17/405,513

(22) Filed: Aug. 18, 2021

(65) Prior Publication Data
US 2021/0396791 A1 Dec. 23, 2021

Related U.S. Application Data

(63) Continuation of application No. 16/456,176, filed on Jun. 28, 2019, now Pat. No. 11,169,187.

(51) Int. Cl.
*G01R 21/133* (2006.01)
*H02J 3/06* (2006.01)
(Continued)

(52) U.S. Cl.
CPC ............ *H02J 3/06* (2013.01); *G01R 19/2513* (2013.01); *G01R 21/133* (2013.01); *H02J 3/00* (2013.01); *H02J 2203/20* (2020.01)

(58) Field of Classification Search
CPC ..... G01R 21/133; G01R 19/2513; H02J 3/06; H02J 3/00; H02J 2203/20; H02J 2310/10; Y02B 10/30; Y02E 60/00; Y04S 40/20
See application file for complete search history.

(56) References Cited

U.S. PATENT DOCUMENTS 6,018,203 A * 1/2000 David .................. H02J 3/144
307/29
8,965,593 B2 * 2/2015 Sun ...................... H02J 3/06
700/286
(Continued)

FOREIGN PATENT DOCUMENTS

CN 103683284 A 3/2014
CN 104578159 B 2/2018

OTHER PUBLICATIONS

Rene Prenc, et al., "A Novel Load Flow Algorithm for Radial Distribution Networks with Dispersed Generation", Technical Gazette, vol. 20, No. 6, 2013, pp. 969-977.
(Continued)

*Primary Examiner* — Tung S Lau
(74) *Attorney, Agent, or Firm* — Oblon, McClelland, Maier & Neustadt, L.L.P.

(57) ABSTRACT

A power distribution system configured as a radial network includes buses having respective voltages, and distribution lines having respective currents. The radial network interconnects the buses with the distribution lines in a tree-like manner. A bus has a link to at least two distribution lines. The bus voltages and distribution line currents are determined by a processing circuitry configured to receive a Branch Matrix (BM), iteratively determine currents for the distribution lines and voltages for each of the buses until a difference is below a predetermined tolerance, and output final bus voltages and final distribution line currents. The circuitry iteratively determines the currents by determining a current matrix (CM) using the BM, and by determining the currents for the plurality of distribution lines in a zig zag manner over the matrix elements in the CM. The system finds a solution using fewer iterations than the backward forward sweep method.

7 Claims, 11 Drawing Sheets

(51) Int. Cl.
 G01R 19/25 (2006.01)
 H02J 3/00 (2006.01)

(56) References Cited

U.S. PATENT DOCUMENTS

| | | | | |
|---|---|---|---|---|
| 9,835,673 | B2* | 12/2017 | Sun | G01R 31/086 |
| 10,491,021 | B1* | 11/2019 | Syracuse | H02J 7/0068 |
| 11,063,472 | B1* | 7/2021 | Ashrafi | G06F 17/11 |
| 2003/0158677 | A1* | 8/2003 | Swarztrauber | G06Q 30/0283 |
| | | | | 702/62 |
| 2012/0022713 | A1* | 1/2012 | Deaver, Sr. | G05B 17/02 |
| | | | | 700/298 |
| 2013/0289905 | A1 | 10/2013 | Ou | |
| 2014/0257715 | A1* | 9/2014 | Chiang | G01R 21/133 |
| | | | | 702/34 |
| 2014/0343878 | A1* | 11/2014 | Gudmundsson | G01R 29/0814 |
| | | | | 702/64 |
| 2016/0094031 | A1* | 3/2016 | Münz | G05B 15/02 |
| | | | | 700/298 |

OTHER PUBLICATIONS

Ritu Parasher, "Load Flow Analysis of Radial Distribution Network Using Linear Data Structure", Department of Computer Science & Engineering, Oct. 2013, 46 pages.

Gadaram Meerimatha, et al., "A Novel Distribution System Power Flow Algorithm using Forward Backward Matrix Method", IOSR Journal of Electrical and Electronics Engineering (IOSR-JEEE), www.iosrjournals.org, vol. 10, Issue 6, Ver. II, Nov.-Dec. 2015, pp. 46-51.

D. Ravi, et al., "Load Flow Analysis for Unbalanced Radial Distribution Systems", International Jounral of Electrical Electronics & Computer Science Engineering, vol. 5, Issue 1, Feb. 2018, pp. 18-23.

J. A. Michline Rupa, et al., "Power Flow Analysis for Radial Distribution System Using Backward/Forward Sweep Method", International Scholarly and Scientific Research & Innovation, World Academy of Science, Engineering and Technology, International Journal of Electrical, Computer, Energetic, Electronic and Communication Engineering, vol. 8, No. 10, 2014, pp. 1551-1555.

D. Shirmohammadi, et al., "A compensation-based power flow method for weakly meshed distribution and transmission networks", IEEE Transactions on Power Systems, vol. 3, No. 2, May 1988, pp. 753-762.

Mesut E. Baran, et al., "Network Reconfiguration in Distribution Systems for Loss Reduction and Load Balancing", IEEE Transactions on Power Delivery, vol. 4, No. 2. Apr. 1989, pp. 1401-1407.

Xiaofeng Zhang, et al., "A Distribution Short Circuit Analysis Approach Using Hybrid Compensation Method", IEEE Transactions on Power Systems, vol. 10, No. 4, Nov. 1995, pp. 2053-2059.

Yuntao Ju, et al., "An Extension of FBS Three-Phase Power Flow for Handling PV Nodes in Active Distribution Networks", IEEE Transactions on Smart Grid, vol. 5, No. 4, Jul. 2014, pp. 1547-1555.

G. W. Chang, et al., "A Simplified Forward and Backward Sweep Approach for Distribution System Load Flow Analysis", International Conference on Power System Technology, 2006, 5 pages.

Jia-Jia Wang, et al., "Reconfiguration of Distribution Network with Dispersed Generators Based on Improved Forward-backward Sweep Method", Asia-Pacific Power and Energy Engineering Conference, 2010, 5 pages.

Kulwinder Kaur, et al., "Optimization and comparison of Distributed Generator in Distribution System Using Backward and forward sweep method", $7^{th}$ India International Conference on Power Electronics (IICPE), 2016, 5 pages.

Padarbinda Samal, et al., "A Modified Forward Backward Sweep Load Flow Algorithm for Unbalanced Radial Distribution Systems", IEEE Power & Energy Society General Meeting, 2015, 5 pages.

Giri Angga Setia, et al., "The Performance Comparison between Fast Decoupled and Backward-Forward Sweep in Solving Distribution Systems", THE $3^{rd}$ IEEE Conference on Power Engineering and Renewable Energy, ICPERE, 2016, pp. 247-251.

* cited by examiner

SYSTEM FOR ANALYZING LOAD FLOW OF A POWER DISTRIBUTION SYSTEM

CROSS-REFERENCE TO RELATED APPLICATIONS

The present application is a Continuation of U.S. application Ser. No. 16/456,176, pending, having a filing date of Jun. 28, 2019.

BACKGROUND

Technical Field

The present disclosure is directed to a method and system for determining the load flow for distribution systems, in particular a method of determining the load flow for extended radial distribution systems where multi-terminal lines exist, the method uses zig zag based load flow in a nodal current matrix.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The electric power energy chain consists of four main parts; generation plants, transmission grid, distribution grid and end-user.

Power plant consists of power generation units of different types under two main categories; 1) conventional (e.g. fossil fuel-based units) and renewables (e.g. solar and wind fuel-based units). Power generation plants could be centralized or distributed and the overall system set up caters for operation, maintenance and emergency scenarios. FIG. 1 is a diagram of an exemplary power grid. The electric power is usually generated at alternating current (AC) using 3-phase configuration. The power leaves the generator 101 and enters a transmission substation 103.

Transmission grid is for long distance transmission and typically transmits at high voltages (above 69 kV). The transmission substation 103 uses transformers to convert the generator's 101 voltage to high voltage levels for long-distance transmission on a transmission grid 105.

The power that comes off the transmission grid 105 is stepped-down to a distribution grid 120. The distribution grid distributes power to homes and businesses at lower voltage level (69 kV and below) for short distances. The distribution grid 120 may step down voltages in several phases in power substations. A main, or bulk, power substation 111 may distribute power to other distribution substations 115. A distribution substation 115 may have transformers that step-down voltages for further power distribution at different voltages. One group of distribution lines 121 may include a transformer 119 to step the power down to a standard line voltage for the set of lines. Another group of distribution lines 121 may leave the distribution substation 115 at a higher voltage. Distribution lines 121 that carry high voltages will be stepped down further before entering residential buildings and businesses. This further stepping-down occurs in other substations or in other transformers 123. Distribution lines 121 running near a house will be reduced from 13800 volts down to 240 volts that makes up a normal household electric service.

In addition to consuming power from the electric power grid, consumers may also generate their own power while being linked to the power grid. Provided a special electrical meter and current inversion equipment, a consumer can obtain power from renewable energy sources such as solar panels and wind turbines. As a consumer generates more power that they need, that excess power may be a power generation source for the power grid. This concept falls under distributed generation.

The electric power distribution system 120 is the final stage in the delivery of electric power. It carries electricity from a transmission system 105 to individual consumers 125. Distribution lines 121 may carry a medium voltage power ranging between 1 kV and 35 kV to distribution transformers 123 which are located near the consumer's premises. Distribution transformers 123 further lower the voltage to the voltage of household appliances and may feed several consumers through secondary distribution lines at this voltage.

Power distribution systems in sparsely populated areas may be configured with a multi-terminal line. As an example, in some sparsely populated areas tapped lines may exist within power distribution networks to save the cost of building a substation at connection points in rural areas. Customers may also have local generation which may contribute to the network. A multi-terminal line is defined as a power line with three or more terminals. FIG. 2 illustrates a three terminal transmission line. A multi-terminal line may have a single circuit line 201 supplying a series of customers, typically in remote communities. The line 201 may have either a load 231, 233 or a power generation 221, 223, 225 or both at any terminal. Each terminal may be connected to an associated transformer 241, 243, 245 and bus 211, 213, 215.

Distribution networks for power distribution systems are of two major types depending on the arrangement of their distribution lines: radial or network. Some distribution network arrangements may be less than a full network, referred to as a weakly meshed structure. A weakly meshed distribution network contains some loops whereas a radial network is without loops. A radial system is arranged like a tree where each customer has one source of supply. A network system has multiple sources of supply operating in parallel. A majority of power distribution systems for sparsely populated areas and remotely scattered hydrocarbon facilities have a radial structure configuration.

As stated above, a distribution system originates at a substation where the electric power is converted from the high voltage transmission system to a lower voltage for delivery to the consumers. A radial distribution system is one in which separate distribution lines, also known as feeders, radiate from a single substation and feed the distributors at only one end. For simplicity, a radial distribution system may be represented as a line diagram. FIG. 3 is an exemplary line diagram for a radial distribution network. The line diagram for the radial distribution network has n nodes (representing buses), b branches (representing transmission lies) and a single voltage source (representing the substation connected to the transmission grid) at the root node. A node (bus, or bus bar) is for local current power distribution and distributes power to distribution lines, which fan out to customers. A branch is a distribution circuit line section between a pair of nodes. In this tree structure, a branch numbering scheme may be used in which the node of a branch L closest to the root node is L1 and the farther node is L2. In other words, a branch starts from a sending node (bus at the root side) and ends at an ending node (bus). A radial distribution network leaves a single station and passes through the network area with no normal connection to any other supply. In this radial delivery network each node is connected to the substation via at least one path. Power flow in the radial distribution network is such that the power is delivered from the main branch to the sub branches then is split out from the sub-branches, where the power is transferred from root node and is split. Power flow in the radial distribution network has no loops and each bus is connected to the source via exactly one path.

Power grids are subjected to great demands due to expansions of the power networks. Rapid development of communities and businesses leads to increased power transmission requirements. The expansion can be accomplished by adding new distribution lines and by upgrading existing lines by adding new devices. The expansion must be made while maintaining a stable power transmission network. Voltage instability in the network may lead to system collapse, when bus voltage drops to such a level from which it cannot recover. In such a situation, complete system blackouts may take place. Voltage stability analysis is performed to ensure expansion of a network is successful and prevents system loss. Load Flow or Power Flow Study and Analysis is performed as part of voltage stability studies and contingency analysis.

To begin a voltage stability analysis of a power system, complex voltages at all busses are determined. After this, power flows from, a bus and the power flowing in all the transmission lines are determined. Such power flow is performed using load flow analysis. Load flow analysis determines steady state voltage magnitudes at all buses, for a particular load condition. Load flow analysis may be used in planning studies, for designing a new network or expansion of an existing network. Calculated values of load flow and voltage may be compared with the steady state device limits in order to estimate the health of the network.

Load flow analysis represents the first building block toward any power system related study. This includes energy forecast, voltage drop and stability analysis in its three parts; steady state, dynamic and transient. The latter requires load flow to calculate the initial conditions.

Load flow or power flow analysis is performed on power distribution systems to understand the nature of the installed network. Load flow analysis is performed as a computational procedure to determine the steady state operating characteristics of a power system network from given line data and bus data, i.e., a given loading. The output of a load flow analysis is nodal voltages and the phase angles, real and reactive power (both sides of each line), power flows and the line losses in a network. Load flow analysis involves finding all possible node voltages. A load flow study may be used to estimate a best location for a new generation station, sub-station and new distribution lines.

Power and voltage constraints when conducting a load flow study impose non-linearity that require iterative techniques to solve. The problem is non-linear because the power flow into load impedances is a function of the square of the applied voltages. Due to the non-linear nature of this problem, numerical methods are employed to obtain a solution that is within an acceptable tolerance.

There are several different methods of solving nonlinear system of equations. Conventional methods include Newton-Raphson method, Gauss-Seidel method, and Fast Decoupling load flow method. The Newton-Raphson method begins with initial guesses of all unknown variables (voltage magnitude and angles at Load Buses and voltage angles at Generator Buses). A Taylor Series is produced for each of the power balance equations included in the system of equations. The system of equations is solved to determine a next guess of voltage magnitude and angles. The process continues until a stopping condition is met. Typically, the stopping condition is to terminate when the mismatch equations are below a specified tolerance. The Gauss-Seidel method is another iterative method that uses little memory and does not solve a matrix. However, the Gauss-Seidel method is slower to converge than other iterative methods. The Fast Decoupling method uses an approximate decoupling of active and reactive flows in well-behaved power networks. The Fast Decoupling method converges faster than the Newton-Raphson method and has been used for real-time management of power grids.

Distribution networks fall into the category of ill-conditioned. Features that relate to an ill-conditioned network include that the network is radial or weakly meshed, a network that has a high R/X ratio, the network performs multi-phase, unbalanced operation, the load for the network is unbalanced and distributed, or generation is distributed. The X/R ratio is the ratio of the system reactance to the system resistance, looking back to the power source from a point in a power circuit. Thus, the X/R ratio is dependent on resistance of a power line.

The majority of power flow algorithms used in industry are based on the Newton-Raphson method and its variants. Conventional methods including the Newton Raphson, Fast Decoupling and Gauss Seidel methods are best suited for well-behaved power distribution systems. The Newton-Raphson method and its variants have been developed specifically for transmission systems which have a meshed structure, with parallel lines and many redundant paths from the generation points to the load points.

However, the Newton-Raphson method and related transmission algorithms have failed with ill-conditioned distribution networks. The Fast Decoupling Load Flow method and the Gauss Seidel power flow technique have been found to be inefficient in solving ill-conditioned power systems. Their computational time is long. See J. A. M. Rupa and S. Ganesh, "Power Flow Analysis for Radial Distribution System Using Backward/Forward Sweep Method," vol. 8, no. 10, pp. 1537-1541, 2014, incorporated herein by reference in its entirety.

A backward/forward sweep (BFS) method has been proposed for ill-conditioned distribution networks, particularly those arranged as a radial distribution network. Unlike Newton-Raphson methods, the backward/forward sweeping method does not need a Jacobian matrix. In the backward/forward sweep method, the power of each branch is calculated using backward propagation and the voltage magnitudes at each node are calculated in forward propagation. The backward/forward sweep method has been found to have fast convergence and is suitable for radial structure.

The Backward/Forward Sweep (BFS) power flow algorithm was developed as a technique capable of solving radial and weakly meshed distribution networks with up to several thousand line sections (branches) and nodes (buses), and that is robust and efficient. The BFS technique is branch-oriented instead of using nodal solution methods such as Newton-Rapson and related techniques. Also, in order to use the BFS technique, a weakly meshed distribution network may be converted to a radial network with no loops. Maximum real and reactive power mismatches at the network nodes may be used as a convergence criteria. See D. Shirmohammadi, H. W. Hong, A. Semlyen, and G. X. Luo, "A compensation-based power flow method for weakly meshed distribution and transmission networks," *IEEE Trans. Power Syst.*, vol. 3, no. 2, pp. 753-762, May 1988 incorporated herein by reference in its entirety. See also M. E. Baran and F. F. Wu, "Network reconfiguration in distribution systems for loss reduction and load balancing," *IEEE Trans. Power Deliv.*, vol. 4, no. 2, pp. 1401-1407, April 1989; Xiaofeng Zhang, F. Soudi, D. Shirmohammadi, and C. S. Cheng, "A distribution short circuit analysis approach using hybrid compensation method," *IEEE Trans. Power Syst.*, vol. 10, no. 4, pp. 2053-2059, November 1995, which are incorporated herein by reference in their entirety.

The backward sweep is a calculation of the power flow through the branches starting from the last branch and proceeding in the backward direction towards the root node. The forward sweep is a calculation of the voltage magnitude and angle of each node starting from the root node and proceeding in the forward direction towards the last node.

In particular, the backward sweep starts from the branches in the last layer and updates effective power flow in each branch by considering the node voltages of a previous iteration. The forward sweep is a voltage drop calculation with possible current or power flow updates. Nodal voltages are updated starting from branches in the first layer toward those in the last layer. A purpose of the forward propagation is to calculate the voltages at each node starting from the feeder source node. During the forward propagation the effective power in each branch is held constant to the value obtained in backward sweep. Also, voltage values obtained in the forward path are held constant during the backward propagation and updated power flows in each branch are transmitted backward along the feeder using the backward path.

Rupa has developed one approach for performing the backward/forward sweep method for power flow analysis in radial distribution systems. The approach in Rupa addresses a problem that the conventional backward forward sweep method is not useful for modern active distribution networks. That method solves a recursive relation of voltage magnitudes. In particular, the method solves recursive relations that use real power, reactive power, and voltage magnitude at each branch. The method can be used to obtain the power losses.

Several references discuss BFS and applied modifications for different purposes. Ju et al. describes a proposed solution that relates to distributed energy resources, in particular distributed generators. The proposed solution is an extension of BFS that solves a problem that convergence deteriorates as the number of PV nodes increases, and may even diverge for large-branch R/X ratios. The proposed solution includes a method for handling PV nodes based on loop analysis incorporated into the BFS technique, where PV nodes refer to nodes connected by distributed generators with constant voltage control. The method of the present disclosure incorporates both Newton's method and the BFS method. In particular, a PV type node (as opposed to a PQ type node) is formulated as a $V\theta$ bus for the DFS procedure, then a correction of voltage angle deviation is obtained with accurate correction equations by the Newton method. See Y. Ju, W. Wu, B. Zhang, and H. Sun, "An Extension of FBS Three-Phase Power Flow for Handling PV Nodes in Active Distribution Networks," *IEEE Trans. Smart Grid*, vol. 5, no. 4, pp. 1547-1555, July 2014—incorporated herein by reference in its entirety.

G. Chang et al. describes a simplified BFS approach that is faster than conventional BFS. Chang et al. describes an approach in which, unlike the commonly used iterative load flow method, uses the real and imaginary decomposition of bus voltages, branch currents and system impedances in terms of real-number quantities. See G. Chang et al. adopted the linear proportion concept to calculate the bus voltages by identifying the real to imaginary ratio of the voltage. See G. Chang, S. Chu, and H. Wang, "A Simplified Forward and Backward Sweep Approach for Distribution System Load Flow Analysis," in 2006 *International Conference on Power System Technology*, 2006, no. 4, pp. 1-5, incorporated herein by reference in its entirety.

J. Wang et al. describe applying a BFS method and a hybrid particle Swarm method to reconfigure distribution networks with distributed power generations. Wang et al. describe using a node-layer incident matrix to find the load flow. See J. Wang, L. Lu, J. Y. Liu, and S. Zhong, "Reconfiguration of Distribution Network with Dispersed Generators Based on Improved Forward-Backward Sweep Method," in 2010 *Asia-Pacific Power and Energy Engineering Conference*, 2010, vol. 2015-Septe, no. 1, pp. 1-5, incorporated herein by reference in its entirety.

Another distributed generator related study is described in K. Kaur et al. BFS was used to carry out base power flow analysis. See K. Kaur and S. Singh, "Optimization and comparison of distributed generator in distribution system using backward and forward sweep method," in 2016 *7th India International Conference on Power Electronics (IICPE)*, 2016, pp. 1-5, incorporated herein by reference in its entirety.

A modified BFS technique for unbalanced radial distribution system is introduced in Samal et al. See P. Samal and S. Ganguly, "A modified forward backward sweep load flow algorithm for unbalanced radial distribution systems," in 2015 *IEEE Power & Energy Society General Meeting*, 2015, vol. 2015-September, pp. 1-5, incorporated herein by reference in its entirety. The method considers the mutual coupling between the phases to obtain higher accuracy. The method utilizes three matrices A, B and C to obtain load flow solutions while identifying buses. Matrix A is formed to know the downstream buses connected to a particular bus. Matrix B is formed to identify the end buses. Matrix C is formed to obtain actual branch currents. The three matrices are used in identifying downstream buses and in calculating branch current or power flow in an easy manner.

G. Setia et al. describe an improved fast decoupled method and an improved BFS method for solving power flow for distribution network. The improved fast decoupled method (Axis Rotation Fast Decoupled Load Flow ARFDLF) uses axis rotation to converge equally good for high R/X networks as low ones and to solve load flow in distribution systems. The improved BFS uses a new data structure. See G. A. Setia, G. H. M. Sianipar, and R. T. Paribo, "The performance comparison between fast decoupled and backward-forward sweep in solving distribution systems," in 2016 *3rd Conference on Power Engineering and Renewable Energy (ICPERE)*, 2016, pp. 247-251, incorporated herein by reference in its entirety.

Several implementations that solve load flow in distributed systems have been described that use algebraic matrix techniques. For example, US Patent Application Publication 2013/0289905 to Ou describes a distribution power flow analysis method. Ou explains that conventional distribution power flow analysis methods require substantial changes in an impedance matrix when a new node or impedance is added. As a solution, Ou describes a distribution power flow analysis system that includes a first relationship matrix and a second relationship matrix. The first relationship matrix indicates a relationship between a node injection current matrix I and a branch current matrix B. The second relationship matrix indicates a relationship between a node mismatch matrix ΔV (mismatch between a reference voltage and voltages of other nodes) and the branch current matrix B. The branch current matrix B is formed by a plurality of branch currents among nodes. The first relationship matrix is an upper triangular matrix only containing 0 and 1. The second relationship matrix is the impedance among nodes, and is a lower triangular matrix.

The method in Ou is applicable to cases of adding a new node, impedance or parallel loop. In particular, Ou explains that when a new node or impedance is added, the first relationship matrix and the second relationship matrix are updated. The first relationship matrix is updated by adding a new column and a new row to the first relationship matrix, which may be accomplished by adding a 1 in the newly added diagonal position and a 0 in the other new positions. The second relationship matrix is updated by adding a new column and a new row, which may be accomplished by adding a new impedance in the newly added diagonal position and a 0 in the other new positions. The method described by Ou is compared to a conventional Gauss implicit Z-matrix method and a Newton-Raphson method.

R. Prenc, et al. is concerned with load flow calculation for radial distribution networks with a large number of nodes. Prenc et al. describes a modification of the backward/forward sweep method that represents distribution lines by a detailed πC equivalent model, which does not neglect parallel capacitance. The proposed algorithm assumes a balanced three phase power distribution network. The proposed algorithm covers the influence of dispersed generation which can be placed at any node on a primary substation feeder.

An implementation of the algorithm in Prenc et al. includes forming an incidence matrix IM, where rows represent branches (lines) of the network, and columns represent nodes. Every matrix element in the IM has a value of 1, when j is the receiving node of branch i, a value of −1, when j is the sending node of branch i, and a value of 0 otherwise. The algorithm transforms the IM to an inverse matrix INV. The algorithm forms a new matrix BR, where rows represent branches of the network, and matrix elements represent the ordinal number of nodes that are fed by each branch. The matrix BR is used in a branch active/reactive power flow, which is the backward sweep of the modified algorithms.

Together with a forward sweep to calculate node voltages, the algorithm can be applied on any radial distribution network configuration with dispersed generation units connected simultaneously in any node of the network. See R. Prenc, D. Skrlec, and V. Koman, "A novel load flow algorithm for radial distribution networks with dispersed generation," December 2013.

G. Meerimatha, et al. describes a method of analyzing the load flow in balanced radial distribution systems, and in particular a technique which takes the topological characteristics of radial distribution systems and solves the system load directly by using a single bus injection branch injection branch current (BIBC) matrix in forward backward sweep method. The BIBC matrix represents the relationship between bus current injections and branch currents. The method described in Meerimatha converges faster than an alternative method that uses two matrices, i.e., BIBC and branch-current to bus voltage (BCBV) matrices, for solution of load flow. See G. Meerimatha, G. Kesavarao, N. Sreenivasulu, "A novel distribution system power flow algorithm using forward backward matrix method," in Journal of Electrical and Electronics Engineering, Vol. 10, Issue 6 Ver. II, November-December 2015, pp. 46-51.

In Meerimatha, backward propagation includes forming the bus injection to branch current matrix and finding injected load currents. For solution of load flow, to determine line flows of a network the branch current matrix is calculated based on BIBC and injected load currents. To determine bus voltages, the forward propagation step determines the bus voltage vector. The real and reactive power loss can be calculated in each branch using the load flow solution.

D. Ravi, et al. describes a method for handling load flow in a radial distribution system. Ravi proposed a simplified approach to an algorithm that requires formation of bus-injection to branch current (BIBC) matrix and branch-current to bus voltage (BCBV) matrix with primitive impedances as elements and distribution load flow (DLF) matrix. The DLF matrix in the algorithm had been obtained as a product of BIBC and BCBV matrices. Ravi proposes an improved technique that uses the distribution load flow (DLF) matrix without requiring the BIBC and BCBV matrices, which take up a large amount of memory space. Ravi noticed features of the DLF matrix and used those features in developing an algorithm that uses a branch path (K) matrix. In particular, the algorithm proposed by Ravi determines the elements of the DLF matrix by comparing rows and columns of a branch path (K) matrix. The K matrix is a combination of 0's and 1's, where the 1's represent information about connecting path between node-1 and any selected node. The diagonal elements of DLF matrix are found based on the K matrix. Off diagonal elements of the DLF matrix are determined based on a comparison of rows of the K matrix. The proposed method in Ravi that does not involve a BIBC matrix and a BCBV matrix has a greatly reduced memory requirement, especially for large distribution systems. See D. Ravi, Dr. V. U. Reddy, D. P. Reddy, "Load flow analysis for unbalanced radial distribution systems," in International Journal of Electrical Electronics & Computer Science Engineering, Vol. 5, Issue I, February 2018, pp. 18-23.

It is one object of the present disclosure to describe a method for determining the load flow for extended radial distribution systems where multi-terminal lines exist. Other objectives include a method for load flow analysis that reduces the number of iterations to converge and offers superior accuracy over a range of bus distribution systems, particularly as compared to the BFS approach. In some aspects, the method involves a Zig Zag-based load flow analysis that calculates initial conditions for an energy forecast, voltage drop or stability analysis.

SUMMARY

An exemplary embodiment relates to a system and method for load flow analysis of a power distribution system configured as a radial network having a plurality of buses, a plurality of power distribution lines, and at least one of the buses has a link to at least two of the power distribution lines. The method performed by processing circuitry configured to receive a Branch Matrix (BM) having a row for each power distribution line and a column for each bus, wherein the BM contains values indicating buses and associated power distribution lines; iteratively determine currents for the plurality of power distribution lines and voltages across each of the buses until a difference between a bus voltage and a previous iterated bus voltage at each bus is below a predetermined tolerance; and display a graph of bus voltages for each bus. The circuitry iteratively determines the currents by determining an initial current matrix (CM') using the BM by multiplying a node current with corresponding matrix elements in the BM, wherein the node current is a ratio of a complex power at a bus and a voltage of the bus; and determining the currents for the plurality of power distribution lines in a zig zag manner over the matrix elements in the CM' and records the determined currents in a final current matrix (CM). The circuitry iteratively determines the voltages by determining the voltage across each bus based on a voltage drop between buses, starting from buses upstream and moving to buses downstream in the direction of voltage flow.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
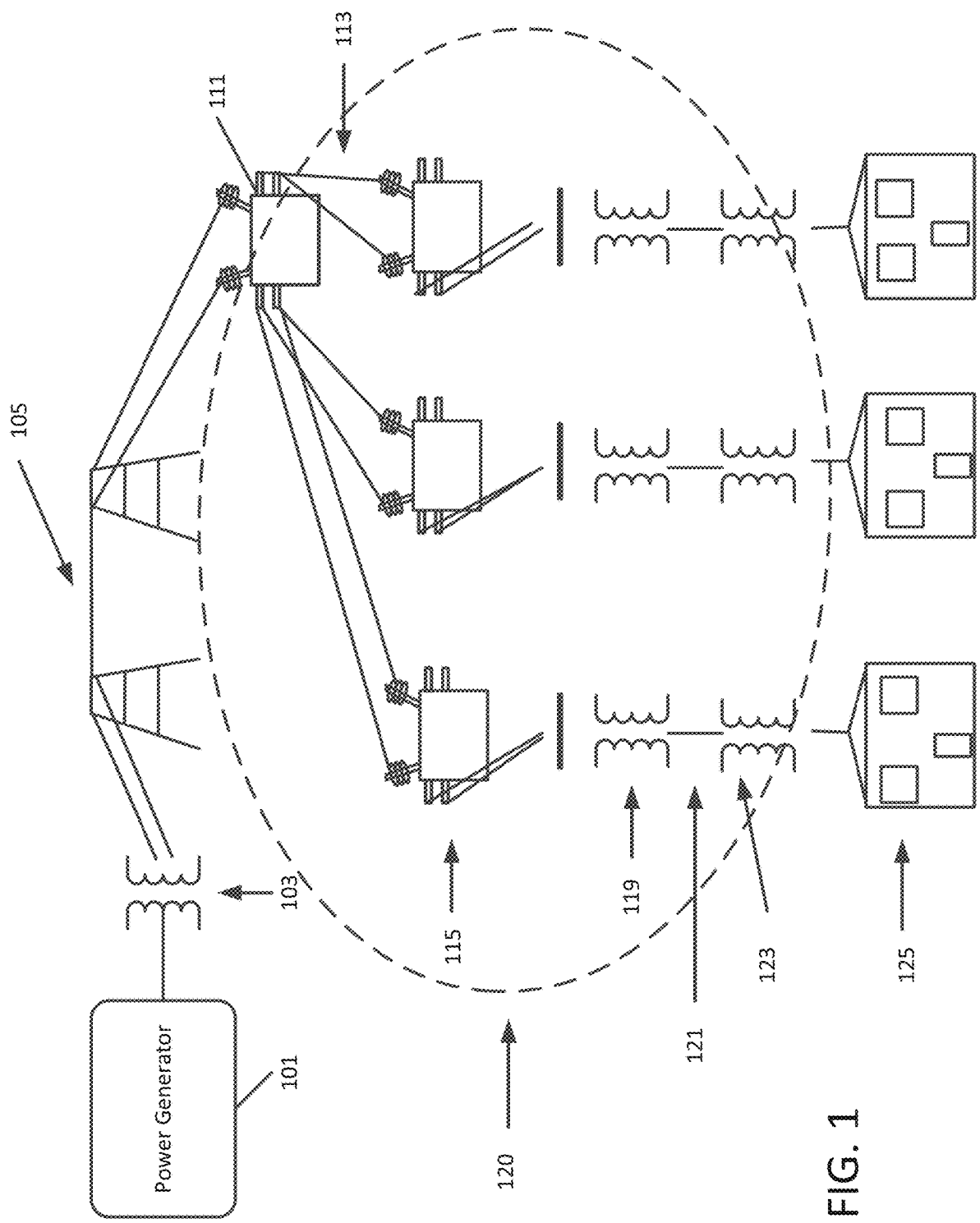
FIG. 1 illustrates an exemplary power grid.
Figure 2:
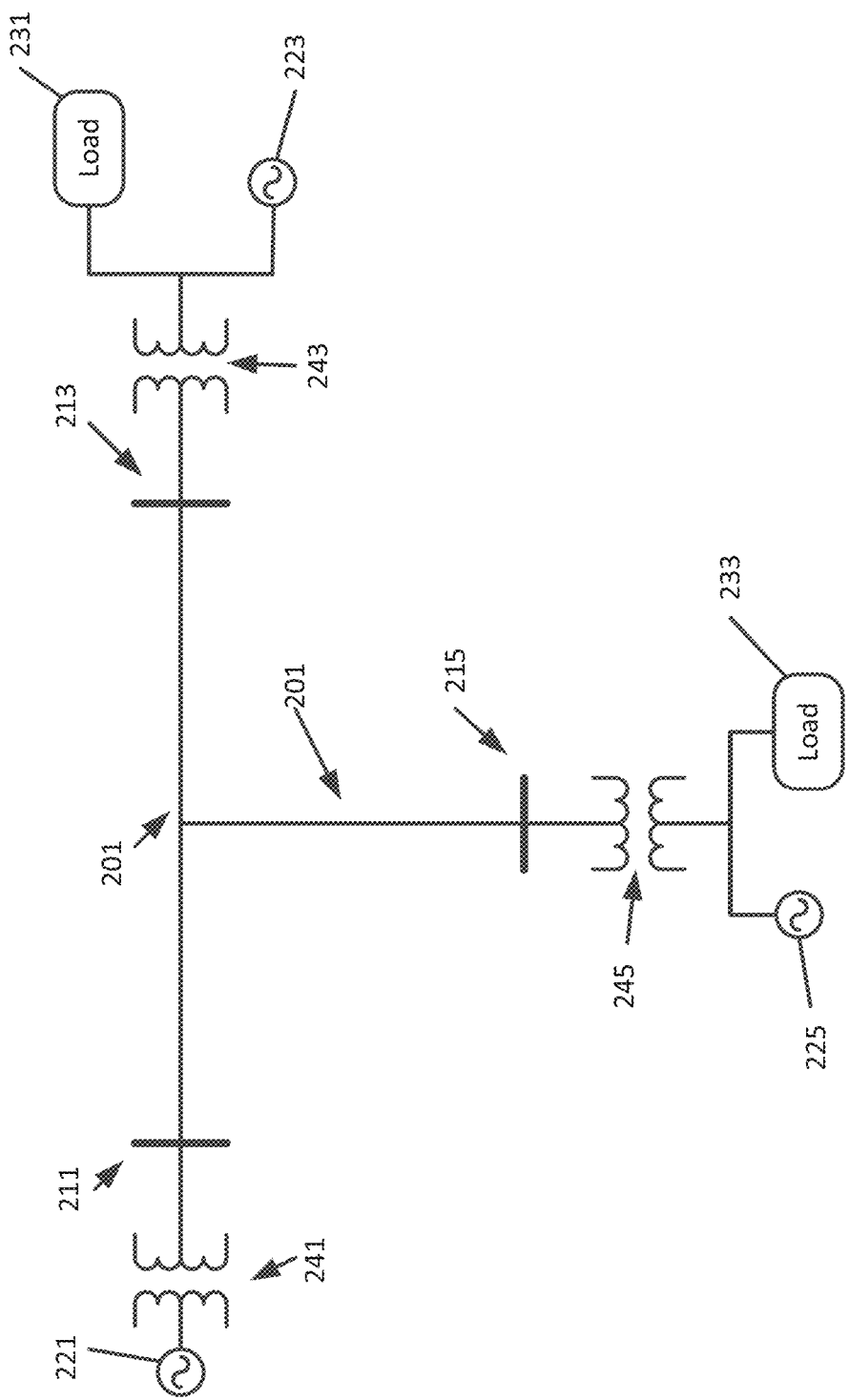
FIG. 2 illustrates a multi-terminal power line.
Figure 3:
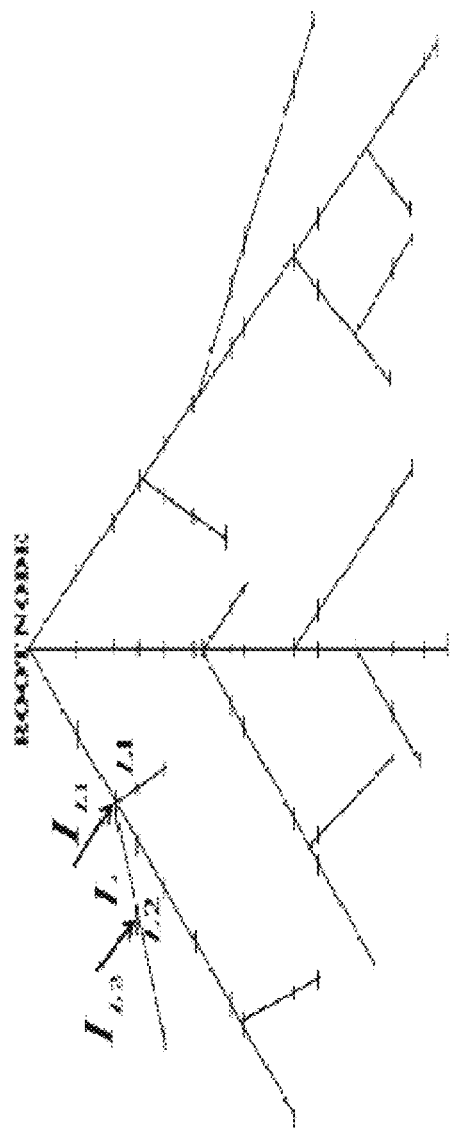
FIG. 3 is a diagram of an exemplary radial distribution system.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Backward/Forward Sweep (BFS) and Zig Zag power flow techniques in this disclosure both achieve accurate distribution load flow results in radial distribution systems. Aspects of this disclosure are directed to a Zig Zag-based load flow approach that achieves the same or better distribution load flow accuracy using fewer iterations to converge than the BFS power flow analysis approach. The Zig Zag-based load flow is applicable to extended radial distribution systems having multi-terminal lines.

The backward/forward sweep method for the load flow computation is an iterative method in which, at each iteration, two computational stages are performed. The first stage is for calculation of the power flow through the branches starting from the last branch and proceeding in the backward direction towards the root node. The other stage is for calculating the voltage magnitude and angle of each node starting from the root node and proceeding in the forward direction towards the last node.

A radial distribution network interconnects the buses with the distribution lines beginning with the root bus in a tree-like manner. The number of buses between a bus and the root bus defines a layer. For example, a bus that is the third bus in the load direction from the root is in a second layer of the network. The distribution lines may be of different lengths, and thus will have corresponding impedance and voltage drop. Also, the voltage of a bus at one of the layers may be different from a voltage of a bus at a different one of the layers. Any bus may have a link to at least two of the distribution lines. The radial configuration entails that there are no connected loops in the system and each node is linked to the source via one way. Loops might exist but separated via a normally open breaker. A distribution system combines single-, two-, and three-phase circuits, delta-connected and unbalanced loads that are considered challenging. It is the most economical power supply and has an acceptable reliability index to certain types of customers. The radial distribution configuration is typically used in sparsely populated areas and in the remote scattered hydrocarbon facilities.

Embodiments of the present invention create a nodal current matrix and, using the nodal current matrix, find the currents for the system branches in a Zig Zag manner. The zig zag manner of finding currents for system branches replaces the backward sweep stage of the BFS method and greatly reduces the number of iterations needed for convergence.

Figure 18:
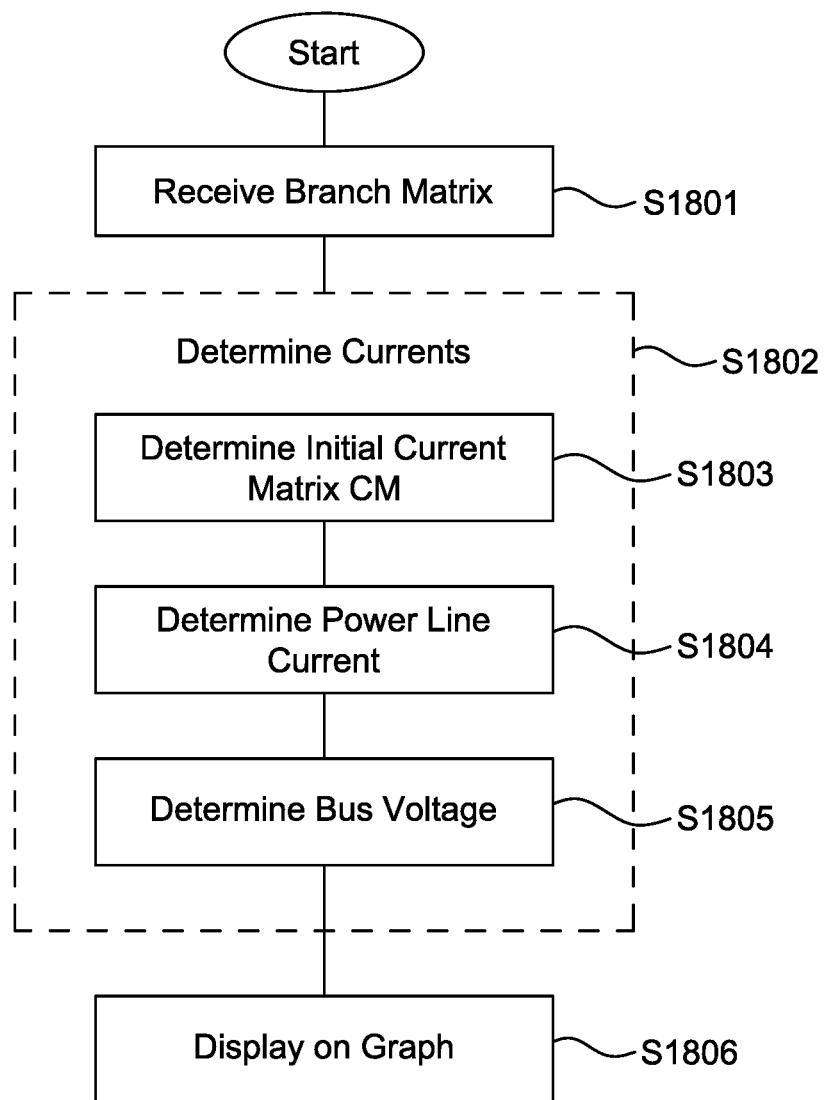
FIG. 18 is a flowchart in accordance with exemplary aspects of the disclosure.

FIG. 18 illustrates an embodiment of the present disclosure in flowchart form. FIG. 18 shows steps of a method for load flow analysis of a power distribution system. The method begins at S1801 that shows receipt of a Branch Matrix (BM) having a row for each power distribution line and a column for each bus in which the BM contains values indicating buses and associated power distribution lines. This is followed by S1802 including determining currents for the plurality of power distribution lines and voltages across each of the buses until a difference between a bus voltage and a previous iterated bus voltage at each bus is below a predetermined tolerance. Determining the current (S1802) includes (S1803) determining an initial current matrix (CM') using the BM by multiplying a node current with corresponding matrix elements in the BM in which the node current is a ratio of a complex power at a bus and a voltage of the bus and (S1804) determining the currents for the plurality of power distribution lines in a zig zag manner over the matrix elements in the CM' and records the determined currents in a final current matrix (CM). S1805 shows determining the voltage across each bus based on a voltage drop between buses, starting from buses upstream and moving to buses downstream in the direction of voltage flow. The bus voltages are displayed on a graph for each bus (S1806).

Computer System

The disclosed methods may be performed in a computer system, such as a laptop computer, desktop computer, or a computer workstation. The disclosed method may also be performed in a virtual computer environment such as a cloud service, data center or virtualized server network.

Figure 4:
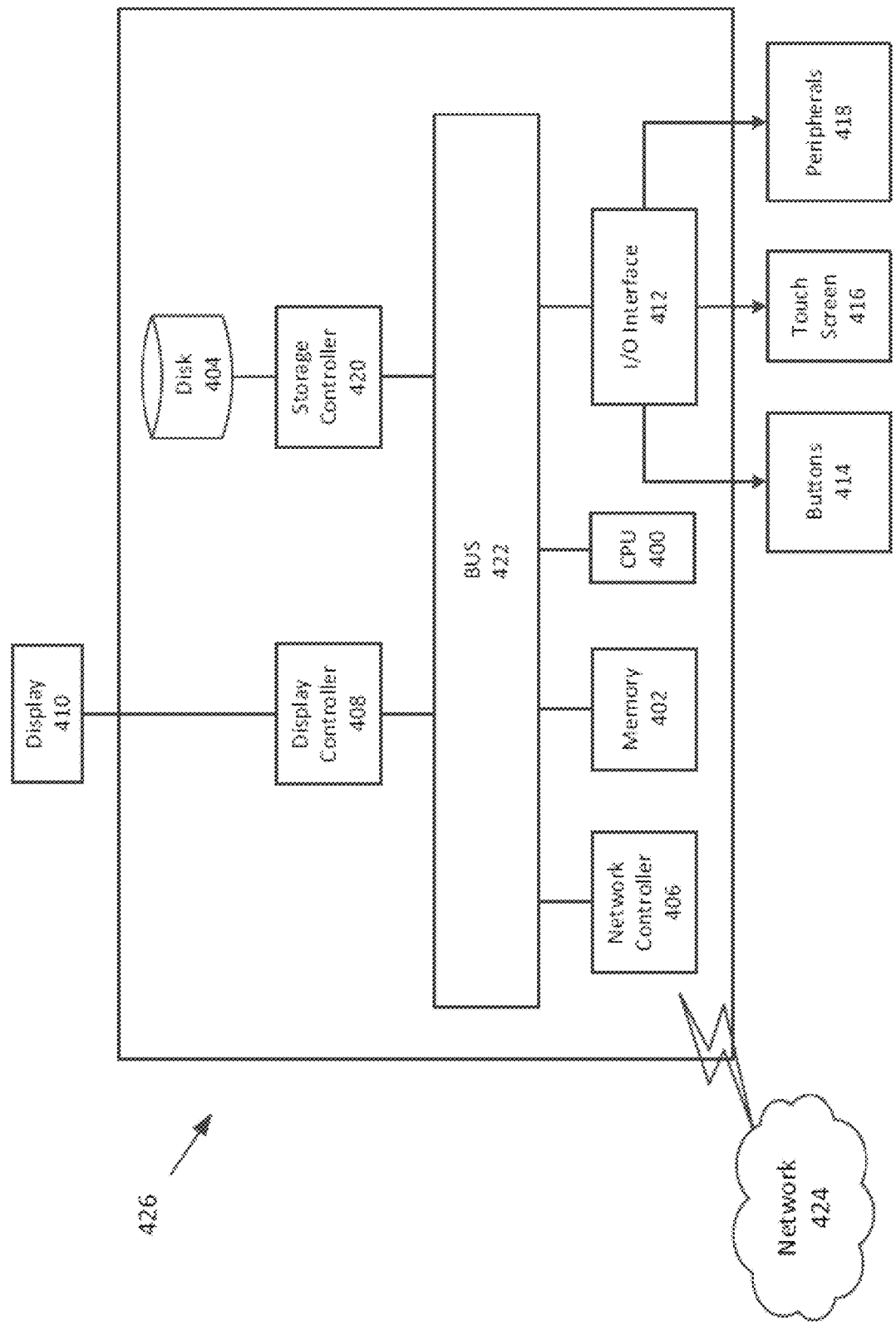
FIG. 4 is a block diagram of the computer system, in accordance with exemplary aspects of the disclosure.

FIG. 4 is a block diagram of a basic computer system. In one implementation, the functions and processes of the computer system may be implemented by a computer 426. Next, a hardware description of the computer 426 according to exemplary embodiments is described with reference to FIG. 4. In FIG. 4, the computer 426 includes a CPU 400 which performs the processes described herein. The process data and instructions may be stored in memory 402. These processes and instructions may also be stored on a storage medium disk 404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 426 communicates, such as a server or computer.

Further, the claimed advancements may be provided as a utility application, background daemon, or component of an operating system, or combination thereof, executing in conjunction with CPU 400 and an operating system such as Microsoft® Windows®, UNIX®, Oracle® Solaris, LINUX®, Apple macOS® and other systems known to those skilled in the art.

In order to achieve the computer 426, the hardware elements may be realized by various circuitry elements, known to those skilled in the art. For example, CPU 400 may be a Xenon® or Core® processor from Intel Corporation of America or an Opteron® processor from AMD of America, or may be other processor types that would be recognized by one of ordinary skill in the art. Alternatively, the CPU 400 may be implemented on an FPGA, ASIC, PLD or using discrete logic circuits, as one of ordinary skill in the art would recognize. Further, CPU 400 may be implemented as multiple processors cooperatively working in parallel to perform the instructions of the inventive processes described above.

The computer 426 in FIG. 4 also includes a network controller 406, such as an Intel Ethernet PRO network interface card from Intel Corporation of America, for interfacing with network 424. As can be appreciated, the network 424 can be a public network, such as the Internet, or a private network such as LAN or WAN network, or any combination thereof and can also include PSTN or ISDN sub-networks. The network 424 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 426 further includes a display controller 408, such as a NVIDIA® GeForce® GTX or Quadro® graphics adaptor from NVIDIA Corporation of America for interfacing with display 410, such as a Hewlett Packard® HPL2445w LCD monitor. A general purpose I/O interface 412 interfaces with a keyboard and/or mouse 414 as well as an optional touch screen panel 416 on or separate from display 410. General purpose I/O interface also connects to a variety of peripherals 418 including printers and scanners, such as an OfficeJet® or DeskJet® from Hewlett Packard®.

The general purpose storage controller 420 connects the storage medium disk 404 with communication bus 422, which may be an ISA, EISA, VESA, PCI, or similar, for interconnecting all of the components of the computer 426. A description of the general features and functionality of the display 410, keyboard and/or mouse 434, as well as the display controller 408, storage controller 420, network controller 406, and general purpose I/O interface 412 is omitted herein for brevity as these features are known.

Backward/Forward Sweep

Rupa describes a backward/forward sweep method that uses an objective function in terms of real and reactive power to find power flow as:

$$P_{k+1} = P_k - P_{loss,\lambda} - P_{Lk+1}$$
$$Q_{k+1} = Q_k - Q_{loss,\lambda} - Q_{Lk+1}$$

where $P_k$ is the real power flowing out of a bus; $Q_k$ is the reactive power flowing out of the bus; $P_{Lk+1}$ is the real power at bus k+1; $Q_{Lk+1}$ is the reactive power at bus k+1, where k is an identifier assigned to a bus and k+1 refers to a bus at the other end of a line in the load direction. During backward propagation, effective real and reactive power flows of all branches are computed. During forward propagation, node (bus) voltages and phase angles are updated. The power loss $P_{loss,k}$ or $Q_{loss,k}$ may be computed in the line section connecting busses k and k+1. The total power loss of the feeder may be determined by summing up the losses of all line sections of the feeder.

Figure 5:
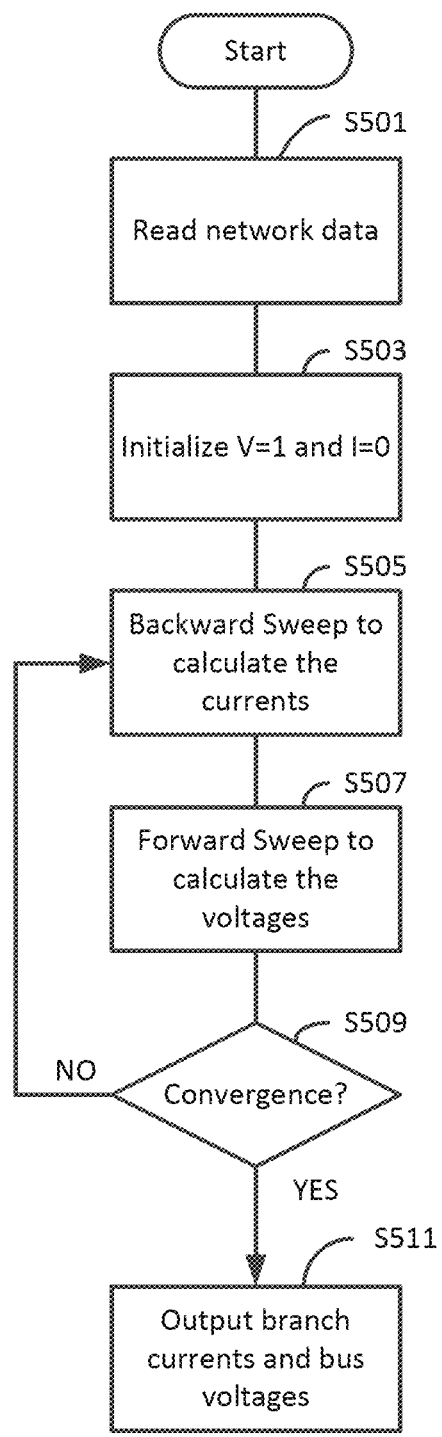
FIG. 5 is a flowchart of a backward/forward sweep (BFS) load flow method.

FIG. 5 is a flowchart of a Backward/Forward Sweep method. The method in FIG. 5 has been implemented for purposes of comparison with the Zig Zag method of the present invention. As mentioned above, BFS is one of the robust techniques that is widely used in a distribution network analysis for load flow in radial distribution systems. This is because of its effectiveness for radial and weak meshed systems.

In S501, the BFS method reads network configuration data. In S503, the BFS method initializes voltage V and current I. The BFS method then performs the backward sweep S505 to calculate currents. The currents are calculated across each branch, starting with the last layer in the system. In the backward sweep, the BFS method moves backward to the branches connected to the Swing bus, which is usually bus no. 1. The currents are calculated using the following formula:

$$I_i = \left(\frac{S_i}{V_i}\right)^* + \sum_{k=a,b,c,\ldots \ etc} I_k \quad (1)$$

Where i is a specific branch in which the current is calculated. The symbols a, b and c, etc. represent the branches connected to Branch i from the load side. For purposes of this disclosure, real and reactive power are represented as the symbol S for complex power in a per unit quantity.

Next, the BFS method performs a forward sweep S507 to calculate the voltages. The voltage across each bus is calculated in a forward manner. In the forward sweep, the BFS method starts with the Swing bus and covers all the other buses in the network. The calculation is performed using the following voltage drop formula.

$$V_i = V_j - I_{ij} Z_{ij} \quad (2)$$

Where i is a specific bus that is under calculation. The symbol j is a bus with a former index (j<i) that is directly connected to i (load side), $I_{ij}$ and $Z_{ij}$ are the current and impedance between buses i and j.

The BFS method is performed iteratively until a convergence criteria, S509, is met. In some BFS approaches, convergence may be achieved when a voltage mismatch (difference between voltage V and a previous voltage V at bus i) is less than a tolerance of about 0.0001.

When the BFS method meets the convergence criteria (YES in S509), in S511, the computer system outputs final branch currents $I_{ij}$ and final bus voltages $V_i$. The final bus voltages may be displayed as a graph for each bus, or a selected range of busses.

Zig Zag-based Load Flow

Disclosed embodiments relate to an improvement over the BFS method. It has been determined that a specific order of processing over a matrix may lead to fewer number of iterations to converge. In particular, the disclosed embodiments involve processing over a matrix in a Zig Zag order. The matrix that is processed in this manner may have several hundred to several thousand rows and columns. The Zig Zag-based load flow method may be implemented as a computer program in a programming language such as Fortran or C, or in a numerical computing environment such as MatLab, Mathematica, or scripting language such as Python, to name a few. The computer program may be executed in a computer system such as that in FIG. 4.

Figure 7:
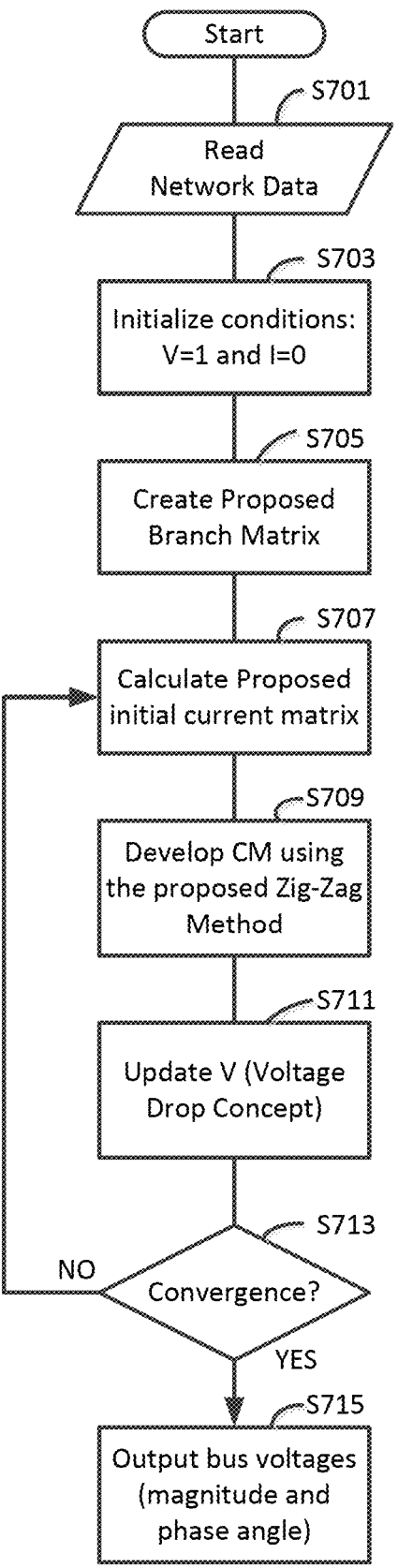
FIG. 7 is a flowchart of a Zig-Zag load flow method, in accordance with exemplary aspects of the disclosure.

FIG. 7 is a flowchart of a Zig Zag-based load flow method, in accordance with exemplary aspects of the disclosure. The Zig Zag method calculates currents using a zig zag pattern over a nodal current matrix instead of using backward sweep as in the BFS method. The Zig Zag-based method is applicable to extended radial distribution systems where multi-terminal lines exist. The Zig Zag-based load flow method begins with, S701, reading in network configuration data and, in S703, initializing voltage V and current I. Configuration data involves labeling of branches and nodes in the radial distribution network. As noted above, a branch is a distribution line between two nodes. A branch will have a current flow and a voltage drop due in part to the length of a branch. A node (bus), also referred to as a bus bar, distributes power to distribution lines, which fan out to other buses or customers. The bus will have a voltage. Also, a load flow analysis may be used for designing a new distribution network or expansion of an existing distribution network. The branches and nodes represent distribution lines and buses for a new distribution network or expansion in an existing network. For purposes of simplifying a representation of a network, branches may be represented as single lines and busses may be represented as a connection point between branches.

After initialization, the Zig Zag-based method includes the following steps:

1) S705, creating a branch matrix (BM) as shown below where the rows reflect the circuit branches and the columns represent circuit buses.

$$BM = \begin{bmatrix} B_{11} & \cdots & B_{1N} \\ \vdots & \ddots & \vdots \\ B_{M1} & \cdots & B_{MN} \end{bmatrix} \quad (3)$$

$$B_{ij} = \begin{cases} 1 & \text{if bus } j \text{ exists in Branch } i \\ 0 & \text{if bus } j \text{ does not exist in Branch } i \end{cases}$$

$B_{ij}$ represents the existence of a bus in a certain branch. It takes either 1 (bus exists) or 0 (bus does not exist). M and N reflects the number of branches and buses in a circuit respectively.

Figure 6:
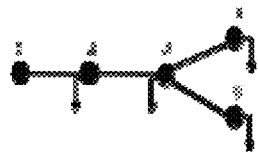
FIG. 6 is an exemplary 5-bus circuit.

FIG. 6 illustrates an example 5-bus circuit with five buses and two branches. A BM matrix for the example 5-bus circuit shown in FIG. 6, is as follows:

$$BM = \begin{bmatrix} 1 & 1 & 1 & 1 & 0 \\ 0 & 0 & 1 & 0 & 1 \end{bmatrix} \quad (4)$$

A value of 1 in the BM matrix indicates a bus associated with the line. The above mentioned system has two lines (Rows 1 and 2) and five buses (Columns 1-5). Line 1 (Row 1) has four buses (Buses 1-4) represented by a value of one at Rows 1-4. Line 2 (Row 2) has two buses (Bus 3 and 5) represented by a value of one at Rows 3 and 5. A value of 0 indicates no bus at the specific line (row).

2) S707, developing a new matrix called initial current matrix (CM').

$$CM' = CM = \begin{bmatrix} I'_{11} & \cdots & I'_{1N} \\ \vdots & \ddots & \vdots \\ I'_{M1} & \cdots & I'_{MN} \end{bmatrix} \quad (4)$$

Where $I'_{ij}$ represent the load current of Bus i given by this formula:

$$I'_{ij} = \left(\frac{S_i}{V_i}\right)^* \quad (5)$$

Where $S_i$ represent complex power at Bus I, $V_i$ represent bus voltage. For the 5-bus test circuit displayed in FIG. 6, the CM matrix is given as follows:

$$CM' = \begin{bmatrix} I'_1 & I'_2 & I'_3 & I'_4 & 0 \\ 0 & 0 & I'_3 & 0 & I'_5 \end{bmatrix} \quad (6)$$

3) In S709, the method determines the currents for the system branches in a Zig Zag manner over the CM matrix and records them in the final matrix denoted by CM matrix. Each bus will have its own current tagged with the branch.

$$CM = \begin{bmatrix} I_{11} & \cdots & I_{1N} \\ \vdots & \ddots & \vdots \\ I_{M1} & \cdots & I_{MN} \end{bmatrix} \quad (7)$$

$$I_{ij} = \sum_{n=1}^{M} \left[ \frac{I'_{ij}}{K_i} + \max_{k=1,2,\ldots,N} I_{ik} \right] x B_{ij} \quad (8)$$

$I_{ij}$ is called the Zig Zag formula which calculates the elements of the CM matrix in a Zig Zag manner. The symbol $K_i$ reflects the number of links connected to a specific Bus i (i.e., K is the number of branches from a source side in the case of multi-terminal lines).

The CM matrix for the 5-bus test circuit presented in FIG. 6 is formulated as follows:

$$CM' = \begin{bmatrix} I_1 & I_2 & I_3 & I_4 & 0 \\ 0 & 0 & I_3 & 0 & I_5 \end{bmatrix} \quad (9)$$

4) In S711, the voltage will be identified using the CM matrix and is calculated using the voltage drop formula, starting from upstream through downstream.

The above steps are repeated iteratively until, in S713, the deviation between the load voltage and the previous voltage is below a specified tolerance for the process to converge. The tolerance may be a predetermined value that is within the precision of the computer system used and the likely accuracy achievable by the load flow analysis.

When the Zig Zag-based method meets the convergence criteria (YES in S713), in S715 the computer system outputs final bus voltages $V_i$. In some embodiments, the final bus voltages may be displayed as a graph for each bus, or a selected range of busses. From the bus voltages (angle and magnitude) all other power circuit parameters can be derived using power flow formulas. This includes active and reactive load flow, voltage drop, losses, etc.

Figure 8:
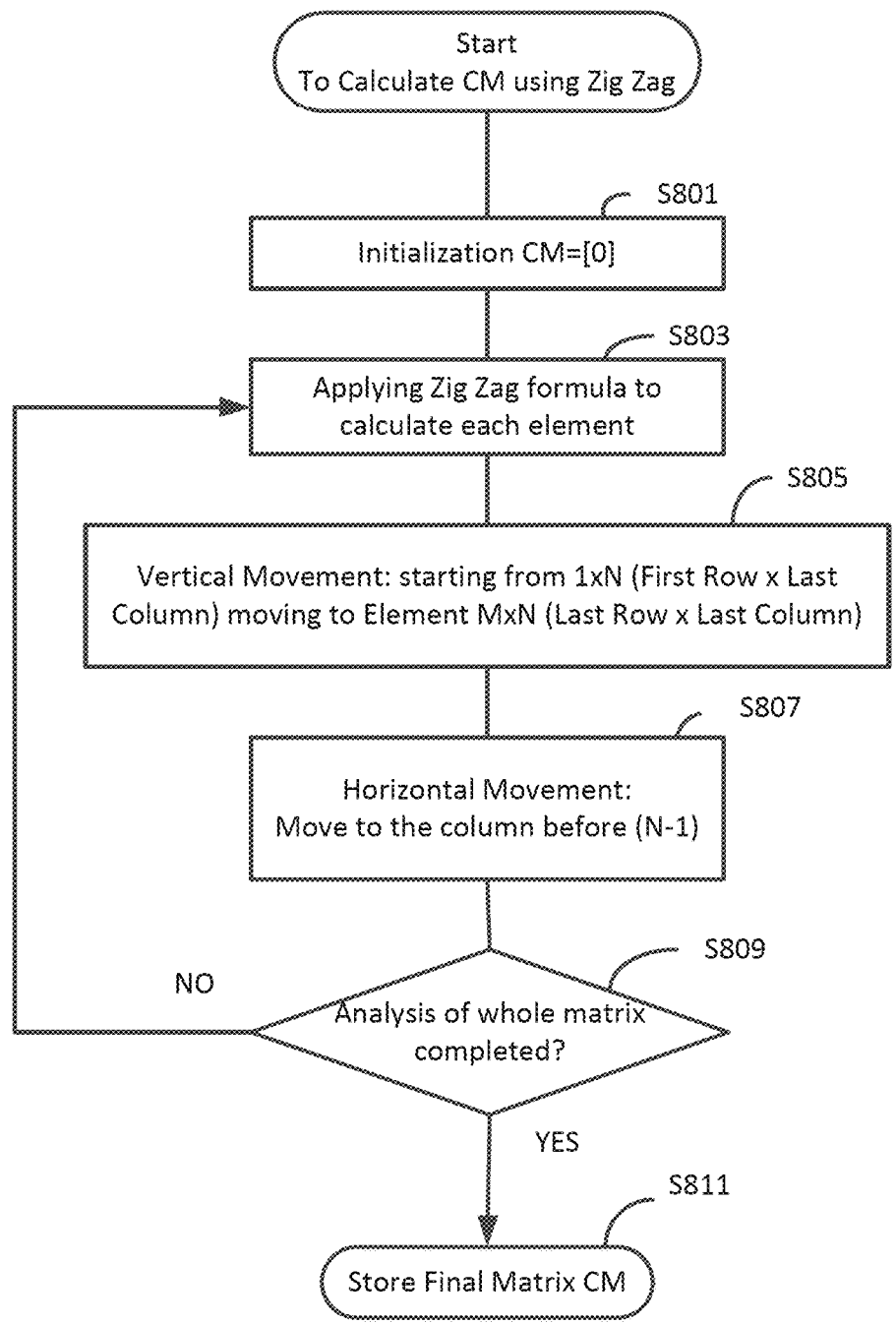
FIG. 8 is a flowchart of a method for finding the currents for the branches in a Zig Zag manner, in accordance with exemplary aspects of the disclosure.
Figure 9:
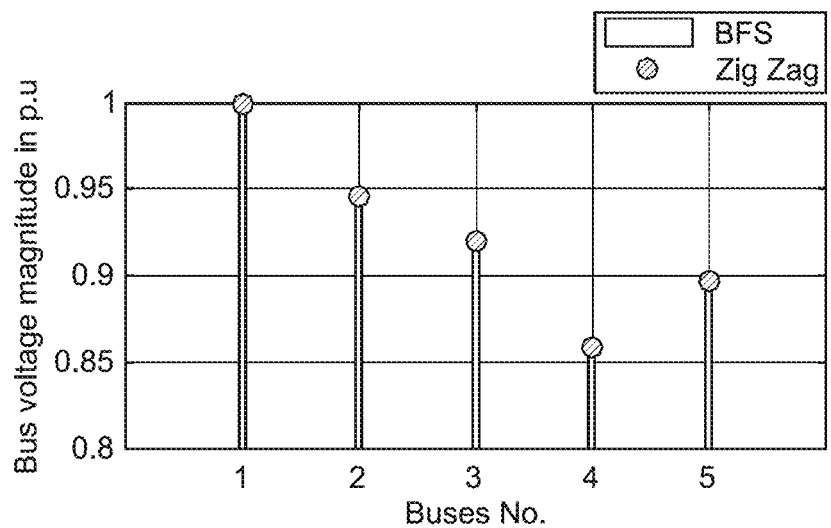
FIG. 9 is a graph of a voltage profile of a 5 node radial distribution network as a comparison of BFS and Zig Zag techniques.
Figure 10:
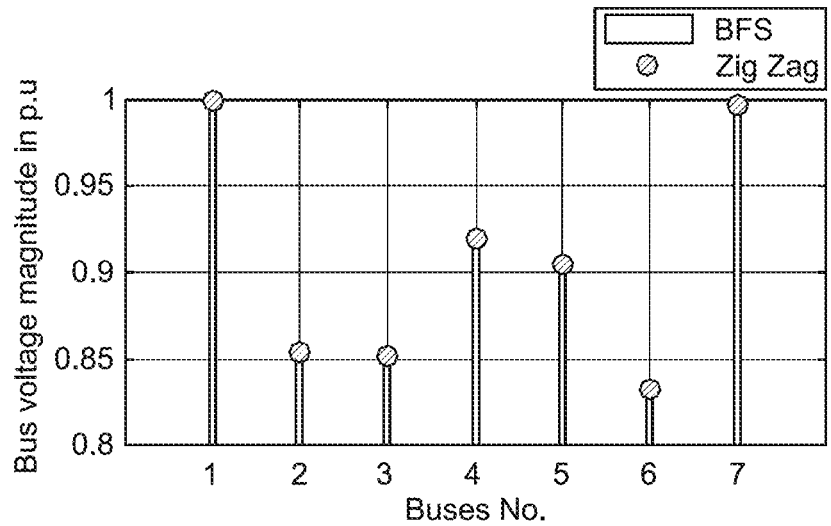
FIG. 10 is a graph of a voltage profile of a 7 node radial distribution network as a comparison of BFS and Zig Zag techniques.
Figure 11:
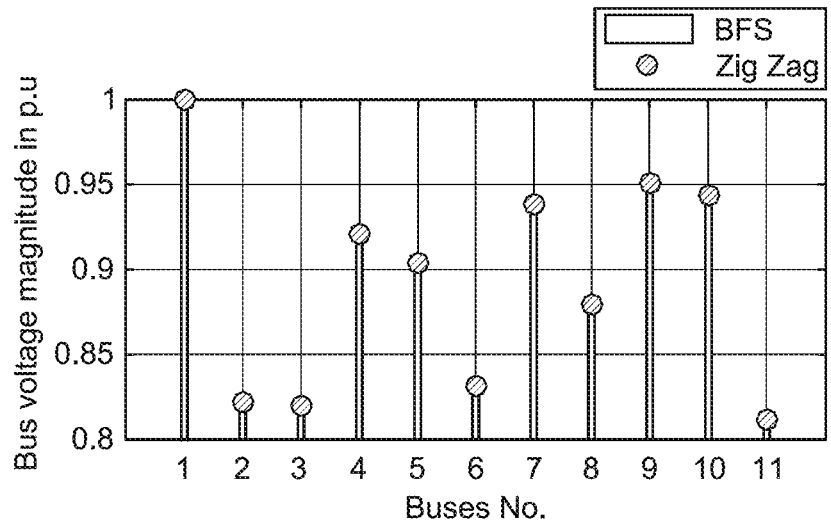
FIG. 11 is a graph of a voltage profile of a 11 node radial distribution network as a comparison of BFS and Zig Zag techniques.
Figure 12:
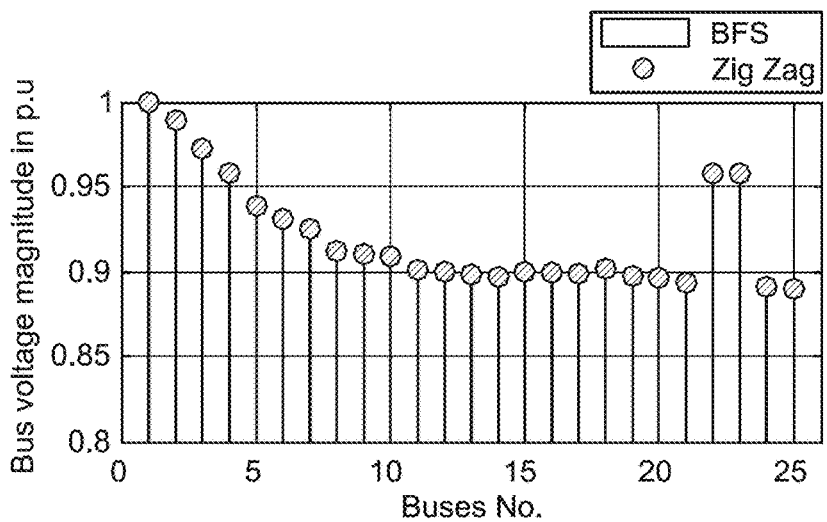
FIG. 12 is a graph of a voltage profile of a 25 node radial distribution network as a comparison of BFS and Zig Zag techniques.
Figure 13:
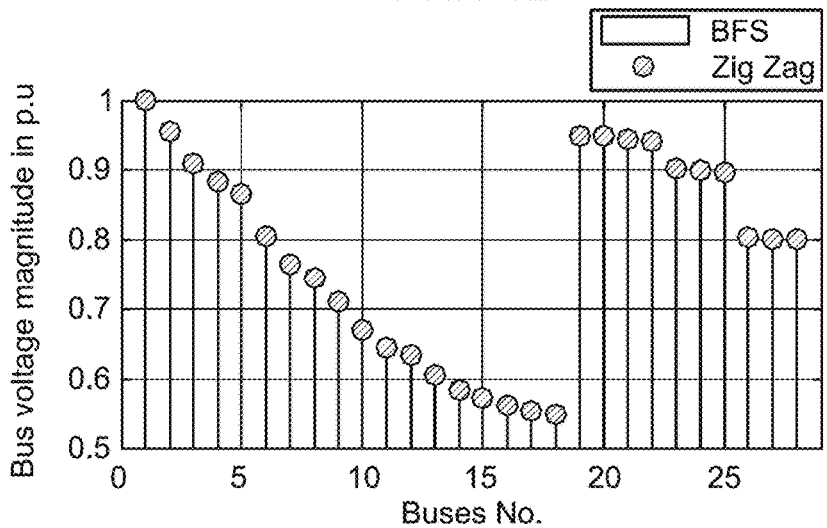
FIG. 13 is a graph of a voltage profile of a 28 node radial distribution network as a comparison of BFS and Zig Zag techniques.
Figure 14:
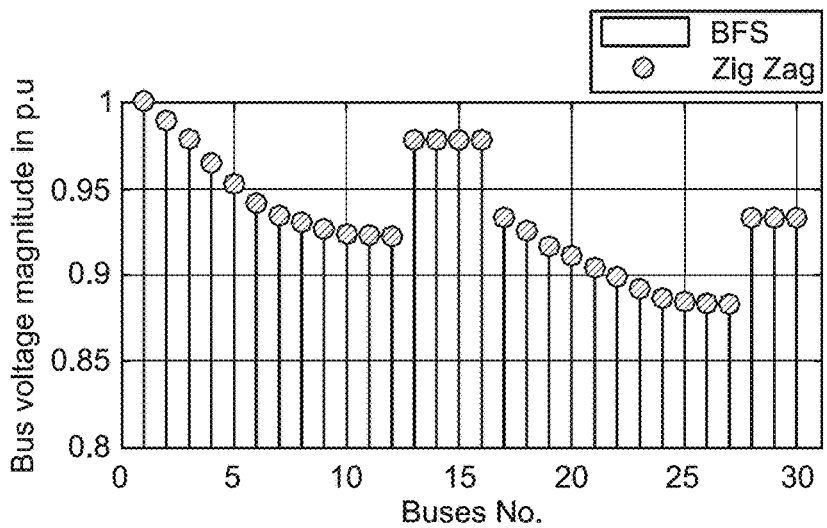
FIG. 14 is a graph of a voltage profile of a 30 node radial distribution network as a comparison of BFS and Zig Zag techniques.
Figure 15:
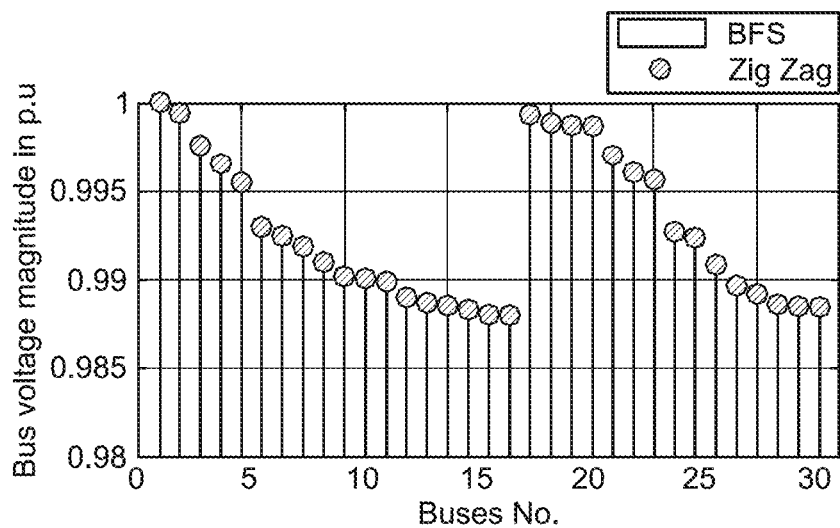
FIG. 15 is a graph of a voltage profile of a 33 node radial distribution network as a comparison of BFS and Zig Zag techniques.
Figure 16:
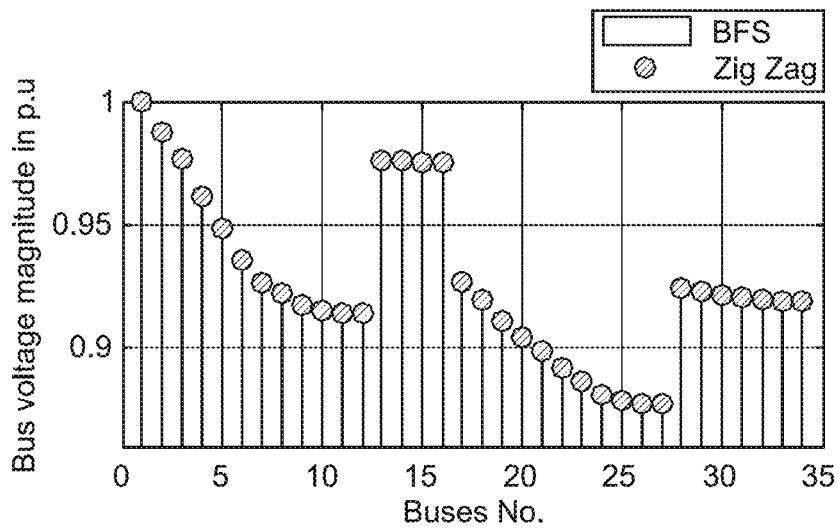
FIG. 16 is a graph of a voltage profile of a 34 node radial distribution network as a comparison of BFS and Zig Zag techniques.
Figure 17:
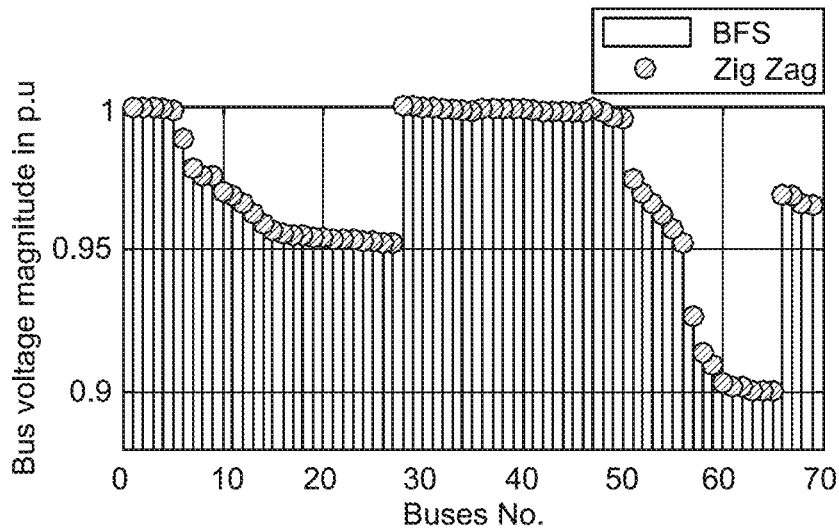
FIG. 17 is a graph of a voltage profile of a 69 node radial distribution network as a comparison of BFS and Zig Zag techniques.

FIG. 8 is a flowchart of a method for finding the currents for the branches in a Zig Zag manner, in accordance with exemplary aspects of the disclosure.

The zig zag method is performed as follows:

1) In S801, initialize the current matrix (CM) by setting all the elements to 0.

2) In S803, apply the Zig Zag formula developed above to calculate all CM elements 3) In S805, in the current matrix (CM), perform vertical movement: starting from 1×N (First Row×Last Column) moving to Element M×N (Last Row×Last Column), where 'x' represents position, adding the matrix element in the first row, Nth column, to the next row in the Nth column, and continuing until the last element in the last column is reached.

In S807, perform horizontal movement: move to the column before (N−1).

Repeating S803 to S807, working backwards through other columns, till, in S809, it completes the analysis for the whole matrix. In S811, the CM matrix is saved and used in determining the voltages.

This Zig Zag methodology is applicable to extended radial with multi-terminal lines distribution system. The matrices approach will cater for any extension in the system by expanding the CM dimension and reflecting the number of terminals in the K factor.

Results

Implementations of the BFS and Zig Zag methods have been developed and tested using 5, 7, 11, 25, 28, 30, 33, 34, and 69-bus distribution systems. The simulation results using the implementations are tabulated in Table, Table 2 and Table 3.

TABLE 2

DEVIATION OF THE LAST TWO ITERATIONS ($10^{-6}$)

| System | BFS | Zig Zag |
|---|---|---|
| 5 | 5.61 | 2.85 |
| 7 | 2.69 | 2.69 |
| 11 | 2.95 | 2.95 |
| 25 | 7.75 | 4.10 |
| 28 | 9.53 | 6.45 |
| 30 | 9.35 | 2.13 |
| 33 | 7.93 | 0.22 |
| 34 | 9.23 | 3.63 |
| 69 | 7.87 | 1.44 |
| Average | 6.99 | 2.94 |

Accuracy of each of the methods is identified based on the differences between last two iterations. Table 2 shows that the Zig Zag method is superior in accuracy by 58% compared to the BFS method.

TABLE 1

Required Iterations to Convergence

| System | BFS | Zig Zag |
|---|---|---|
| 5 | 9 | 7 |
| 7 | 8 | 8 |
| 11 | 9 | 9 |
| 25 | 42 | 7 |
| 28 | 141 | 23 |
| 30 | 44 | 7 |
| 33 | 25 | 4 |
| 34 | 46 | 7 |
| 69 | 50 | 7 |
| Average | 42 | 9 |

The average iterations required by the BFS method to converge is approximately five times the iterations required by the Zig Zag method as demonstrated in Table 1 (42 iterations for BFS compared to 9 for Zig Zag). The number of iterations associated with each case study for the two methods are presented in Table 1. For example, the results for the 5-bus test circuit converged after seven iterations for the Zig Zag method and resulted in a difference between the last iteration and the one before of 2.85E-06. This shows the robustness and the effectiveness of the Zig Zag method.

TABLE 3

| Elapsed Time to Converge | | |
|---|---|---|
| System | BFS | Zig Zag |
| 5 | 0.024248 | 0.024681 |
| 7 | 0.020715 | 0.031041 |
| 11 | 0.021658 | 0.035335 |
| 25 | 0.027870 | 0.034460 |
| 28 | 0.039134 | 0.059562 |
| 30 | 0.029935 | 0.034840 |
| 33 | 0.028292 | 0.027398 |
| 34 | 0.038784 | 0.032420 |
| 69 | 0.041999 | 0.049108 |
| Average | 0.030293 | 0.036538 |

In terms of elapsed time, though the Zig Zag method can provide comparatively outstanding results when compared to the BFS method, the time taken by the Zig Zag method is pretty much the same as the BFS method as observed in Table 3, and also the quality of the solution is better. As a result, a conclusion can be made that the Zig Zag method is the best technique for the studied systems and results in considerably better solutions. Also, better convergence time may be achieved from the Zig Zag method by further optimization of the algorithm.

The voltage profiles of the simulated systems for 5, 7, 11, 25, 28, 30, 33, 34, and 69-bus distribution systems are displayed in FIG. 9 to FIG. 17. The two methods are shown in each figure to compare the load flow results. The figures prove the effectiveness of the Zig Zag method as it has provided exactly the same voltage profiles as obtained by the BFS method.

Numerous modifications and variations of the present invention are possible in light of the above teachings. It is therefore to be understood that within the scope of the appended claims, the invention may be practiced otherwise than as specifically described herein.

The invention claimed is:

1. A system for analyzing load flow of a power distribution system including, in electrical connection, an electricity generation plant, an electricity transmission grid, and an electricity distribution grid having a plurality of power distribution lines, wherein the power distribution system is configured as a radial network having a plurality of buses, the plurality of power distribution lines, and at least one of the buses has a link to at least two of the power distribution lines, the system comprises processing circuitry configured to:

receive a Branch Matrix (BM) having a row for each power distribution line and a column for each bus, wherein the BM contains values indicating buses and associated power distribution lines, iteratively determine currents for the plurality of power distribution lines and voltages across each of the buses until a difference between a bus voltage and a previous iterated bus voltage at each bus is below a predetermined tolerance, and display a graph of bus voltages for each bus as a voltage profile, wherein the circuitry iteratively determines the currents by determining an initial current matrix (CM') using the BM by multiplying a node current with corresponding matrix elements in the BM, wherein the node current is a ratio of a complex power at a bus and a voltage of the bus, and determining the currents for the plurality of power distribution lines in a zig zag manner over the matrix elements in the CM' and records the determined currents in a final current matrix (CM), the circuitry iteratively determines the voltages by determining the voltage across each bus based on a voltage drop between buses, starting from buses upstream and moving to buses downstream in the direction of voltage flow.

2. The system of claim 1, wherein the circuitry determines the currents for the plurality of power distribution lines in the Zig Zag manner by iteratively performing, over all elements of the initial current matrix CM', applying a Zig Zag formula to calculate CM elements $I_{ij}$ in accordance with $$I_{ij} = \sum_{n=1}^{M} \left[ \frac{I'_{ij}}{K_i} + \max_{k=1,2,\ldots,N} I_{ik} \right] x B_{ij}$$

wherein $K_i$ is a number of branches from a source side, $B_{ij}$ represents the existence of a bus in a certain branch, in a vertical movement, adding the matrix element in the first row, Nth column, to the next row in the Nth column, and continuing until the last element in the last row, last column is reached;

in a horizontal movement, moving to column before N−1; and working backwards through all other columns in the matrix CM.

3. The system of claim 1, wherein the circuitry determines the voltage across each bus based on a voltage drop between nodes in accordance with $$V_i = V_j - I_{ij} Z_{ij}$$

where i is a specific bus, the symbol j is a bus with a former index (j<i) that is directly connected to i, and $I_{ij}$ and $Z_{ij}$ are the current and impedance, respectively, between buses i and j.

4. The system of claim 1, wherein the power distribution system is configured as an extended radial network having multi-terminal distribution lines, wherein the number of links connected to the bus is the number of multi-terminal distribution lines connected to the bus.

5. The system of claim 1, wherein the power distribution system is configured as a radial network having an X/R ratio less than 10, wherein the X/R ratio is the amount of reactance X divided by the amount of resistance R.

6. The system of claim 1, wherein the circuitry receives the BM containing the matrix elements having a value of 1 for each power distribution line that leads to a bus and a value of 0 for no power distribution line.

7. The system of claim 1, wherein each bus is a bus bar, wherein the circuitry iteratively determines voltages across each bus bar.

* * * * *